United States Patent
Ni et al.

(10) Patent No.: US 8,378,490 B2
(45) Date of Patent: Feb. 19, 2013

(54) SEMICONDUCTOR APPARATUS INCLUDING A METAL ALLOY BETWEEN A FIRST CONTACT AND A SECOND CONTACT

(75) Inventors: Chyi-Tsong Ni, Hsinchu (TW); I-Shi Wang, Sanxia Township (TW); Hsin-Kuei Lee, Hsinchu (TW); Ching-Hou Su, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/048,127

(22) Filed: Mar. 15, 2011

(65) Prior Publication Data
US 2012/0235301 A1    Sep. 20, 2012

(51) Int. Cl.
*H01L 23/48*    (2006.01)
(52) U.S. Cl. ........ 257/757; 257/758; 257/761; 257/762; 257/763; 257/764; 257/765; 257/766; 257/767; 257/768; 257/769; 257/770; 257/771; 257/210; 257/211; 257/508
(58) Field of Classification Search .................. 257/757, 257/758, 210, 211, 503, 508
See application file for complete search history.

(56) References Cited

U.S. PATENT DOCUMENTS

| | | | | |
|---|---|---|---|---|
| 5,102,821 A * | 4/1992 | Moslehi | .................. | 438/456 |
| 5,217,922 A * | 6/1993 | Akasaki et al. | ................ | 438/125 |
| 5,290,715 A * | 3/1994 | Pandya | .................... | 438/311 |
| 6,221,197 B1 * | 4/2001 | Mori et al. | ................. | 156/308.6 |
| 6,245,661 B1 * | 6/2001 | Matsumoto et al. | ........... | 438/622 |
| 6,555,901 B1 * | 4/2003 | Yoshihara et al. | ............. | 257/684 |
| 6,740,567 B2 * | 5/2004 | Liang et al. | ................. | 438/459 |
| 6,969,667 B2 * | 11/2005 | Liebeskind et al. | ........... | 438/455 |
| 7,400,042 B2 * | 7/2008 | Eriksen et al. | ................. | 257/757 |
| 7,442,570 B2 * | 10/2008 | Nasiri et al. | ..................... | 438/48 |
| 2003/0006062 A1 * | 1/2003 | Stone et al. | .................... | 174/255 |
| 2006/0249847 A1 * | 11/2006 | Eriksen et al. | ................. | 257/751 |
| 2007/0254454 A1 * | 11/2007 | Mastromatteo et al. | ....... | 438/455 |
| 2008/0246152 A1 * | 10/2008 | Liu et al. | ......................... | 257/758 |
| 2009/0250736 A1 * | 10/2009 | Yoon et al. | ..................... | 257/296 |
| 2011/0049652 A1 * | 3/2011 | Wu et al. | ........................ | 257/417 |

* cited by examiner

*Primary Examiner* — Marcos D. Pizarro
*Assistant Examiner* — Bilkis Jahan
(74) *Attorney, Agent, or Firm* — Lowe Hauptman Ham & Berner, LLP

(57) ABSTRACT

A method of integrated circuit fabrication is provided, and more particularly fabrication of a semiconductor apparatus with a metallic alloy. An exemplary structure for a semiconductor apparatus comprises a first silicon substrate having a first contact comprising a silicide layer between the substrate and a first metal layer; a second silicon substrate having a second contact comprising a second metal layer; and a metallic alloy between the first metal layer of the first contact and the second metal layer of the second contact.

20 Claims, 4 Drawing Sheets

SEMICONDUCTOR APPARATUS INCLUDING A METAL ALLOY BETWEEN A FIRST CONTACT AND A SECOND CONTACT

FIELD OF THE INVENTION

The invention relates to integrated circuit fabrication, and more particularly to a semiconductor apparatus with a metallic alloy.

BACKGROUND

Micro-electro-mechanical system (MEMS) technology is the integration of very small mechanical devices installed inside a silicon substrate such as sensors, valves, gears, reflecting minors, and drivers on a computer. Thus, MEMS devices are often called intelligent machines. To protect against external interference during operation, it may be desirable to bond with a cap substrate to hermetically seal the MEMS devices to form a semiconductor apparatus. Furthermore, in many applications, it is also desirable for the bonded substrates to include integrated circuit (IC) devices.

However, there are challenges to implementing such features and processes in MEMS or IC device fabrication. For example, in a "substrate bonding" process, it is difficult to achieve a low-contact-resistance bond between bonded substrates because high-contact-resistance materials are generated in the interface between the bonded substrates, thereby increasing the likelihood of semiconductor apparatus instability and/or semiconductor apparatus failure.

Accordingly, what is needed is a method to form a low-contact-resistance bond between bonded substrates.

SUMMARY

In one embodiment, a semiconductor apparatus comprises a first silicon substrate having a first contact comprising a silicide layer between the substrate and a first metal layer; a second silicon substrate having a second contact comprising a second metal layer; and a metallic alloy between the first metal layer of the first contact and the second metal layer of the second contact.

In another embodiment, a method for fabricating a semiconductor apparatus comprises providing a first silicon substrate having a first contact comprising a silicide layer between the substrate and a first metal layer; providing a second silicon substrate having a second contact comprising a second metal layer; placing the first contact in contact with the second contact; and heating the first and second metal layers to form a metallic alloy, whereby the metallic alloy bonds the first contact to the second contact.

A detailed description is given in the following embodiments with reference to the accompanying drawings.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

Figure 1:
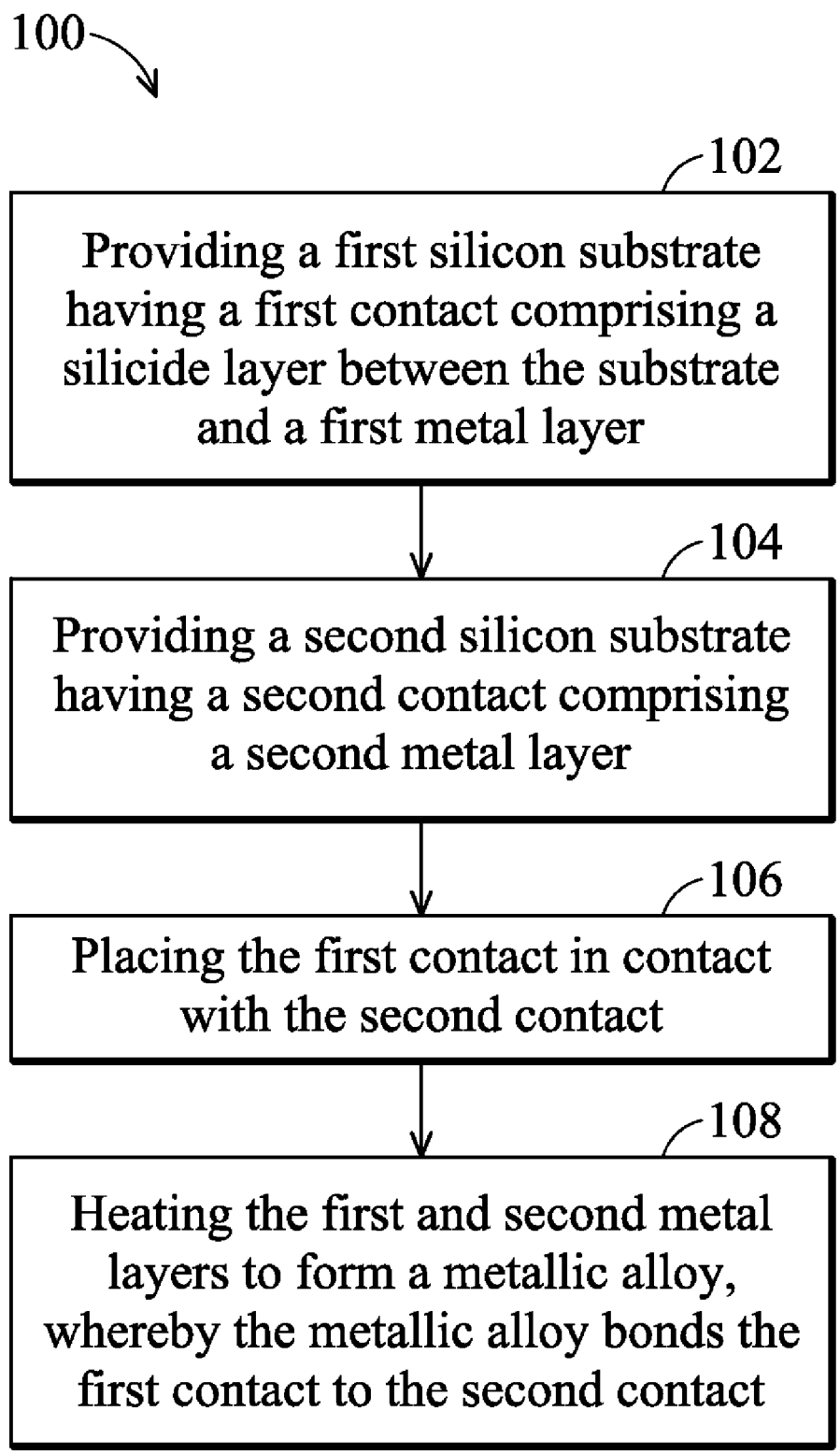
FIG. 1 is a flowchart illustrating a method for fabricating a semiconductor apparatus comprising a metallic alloy according to various aspects of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity. In addition, the present disclosure may repeat reference numerals and/or letters in the various examples. This repetition is for the purpose of simplicity and clarity and does not in itself dictate a relationship between the various embodiments and/or configurations discussed.

Referring to FIG. 1, illustrated is a flowchart of a method 100 for fabricating a semiconductor apparatus comprising a metallic alloy according to various aspects of the present disclosure. The method 100 begins with step 102 in which a first silicon substrate having a first contact comprising a silicide layer between the substrate and a first metal layer is provided. The method 100 continues with step 104 in which a second silicon substrate having a second contact comprising a second metal layer is provided. The method 100 continues with step 106 in which the first contact is placed in contact with the second contact. The method 100 continues with step 108 in which the first and second metal layers are heated to form a metallic alloy, whereby the metallic alloy bonds the first contact to the second contact. The discussion that follows illustrates an embodiment of a method in accordance with FIG. 1.

FIGS. 2A-2F show schematic cross-sectional views of a metallic alloy 220 of a semiconductor apparatus 200 at various stages of fabrication according to various aspects of the present disclosure. It is noted that the method of FIG. 1 does not produce a completed semiconductor apparatus 200. Accordingly, it is understood that additional processes may be provided before, during, and after the method 100 of FIG. 1, and that some other processes may only be briefly described herein. Also, FIGS. 2A through 2F are simplified for a better understanding of the inventive concepts of the present disclosure. For example, although the figures illustrate the metallic alloy 220 of a semiconductor apparatus 200, it is understood the semiconductor apparatus 200 may be part of an integrated circuit that further comprises a number of other components such as under-fill, lead-frame, etc.

Referring to FIGS. 2A-2D, a first silicon substrate 202 is provided. The step of providing the first silicon substrate 202 may further comprise partially fabricating a first contact 210 comprising a silicide layer 208 between the substrate 202 and a first metal layer 206. The first silicon substrate 202 may comprise a pure silicon substrate. In another embodiment, the first silicon substrate 202 may be a semiconductor on insulator, such as silicon on insulator (SOI) or silicon on sapphire.

In other embodiments, the substrate 202 may comprise a doped epitaxial (epi) layer, a gradient semiconductor layer, and/or may further include a semiconductor layer overlying another semiconductor layer of a different type, such as a silicon layer on a silicon germanium layer.

In one embodiment, the first silicon substrate 202 may further comprise a plurality of microelectromechanical system (MEMS) devices (not shown). The MEMS devices are the integration of very small mechanical devices installed inside the first silicon substrate 202 such as sensors, valves, gears, reflecting minors, and drivers on a computer. Therefore, the MEMS devices can be used for a variety of devices including oscillators, channels, pumps, accelerometers, and filters. The MEMS devices may be manufactured using surface micromechanics, deposition, or etching technologies.

In another embodiment, the first silicon substrate 202 may further comprise a plurality of isolation features (not shown), such as shallow trench isolation (STI) features or local oxidation of silicon (LOCOS) features. The isolation features may define and isolate various microelectronic elements (not shown).

Examples of the various microelectronic elements that may be formed in the first silicon substrate 202 comprise transistors (e.g., p-channel/n-channel metal oxide semiconductor field effect transistors (pMOSFETs/nMOSFETs), bipolar junction transistors (BJTs), high voltage transistors, high frequency transistors, etc.); diodes; resistors; capacitors; inductors; fuses; and other suitable elements. Various processes are performed to form the various microelectronic elements including deposition, photolithography, implantation, etching, annealing, and other suitable processes. The microelectronic elements are interconnected to form an integrated circuit (IC) device, such as a logic device, memory device (e.g., static random access memory or SRAM), radio frequency (RF) device, input/output (I/O) device, system-on-chip (SoC) device, combinations thereof, and other suitable types of devices.

The substrate 202 further comprises inter-layer dielectric (ILD) layers, inter-metal dielectric (IMD) layers and a metallization structure overlying the IC device. The IMD layers in the metallization structure include low-k dielectric materials, un-doped silicate glass (USG), fluorine-doped silicate glass (FSG), carbon-doped silicate glass, silicon nitride, silicon oxynitride, or other materials. The dielectric constants (k value) of the low-k dielectric materials may be less than about 3.9, or less than about 2.3. Metal lines in the metallization structure may be formed of aluminum, aluminum alloy, copper, copper alloys, or other conductive materials. One skilled in the art will realize the formation details of the metallization structure.

Figure 2A:
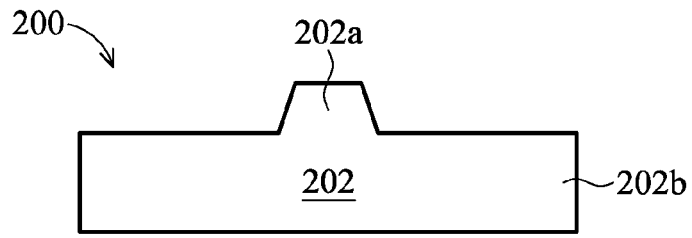
FIGS. 2A-2F show schematic cross-sectional views of a metallic alloy of a semiconductor apparatus at various stages of fabrication according to various aspects of the present disclosure.

Still referring to FIG. 2A, the first silicon substrate 202 further comprises a raised portion 202a for electrically connecting the MEMS device or IC device to an external contact, and lowered portions 202b to accommodate proof mass of the MEMS device. Various processes are performed to form the raised portion 202a including photolithography, etching and other suitable processes. While only one raised portion 202a is illustrated as being formed in the first silicon substrate 202, it is understood that any number of raised portions 202a may be formed in the first silicon substrate 202.

Figure 2B:
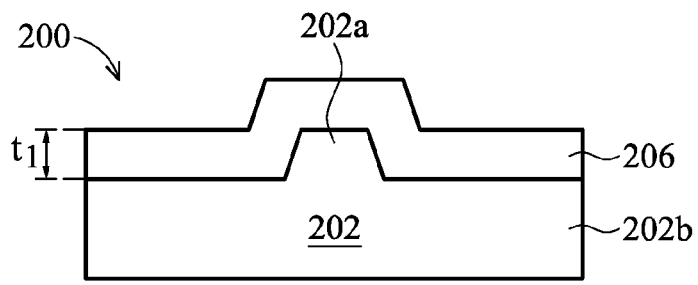

Referring to FIG. 2B, after the raised portion 202a formation process, a first metal layer 206 is then deposited over and extending out of the lowered portions 202b and onto the raised portion 202a. In one embodiment, the first metal layer 206 comprises a material selected from a group of Ti, Co, Ni, W, and Pt. The first metal layer 206 may be formed by chemical vapor deposition (CVD), physical vapor deposition (PVD) or other suitable technique. In the present embodiment, the first metal layer 206 has a thickness $t_1$ ranging from 300 to 1000 angstroms.

Figure 2C:
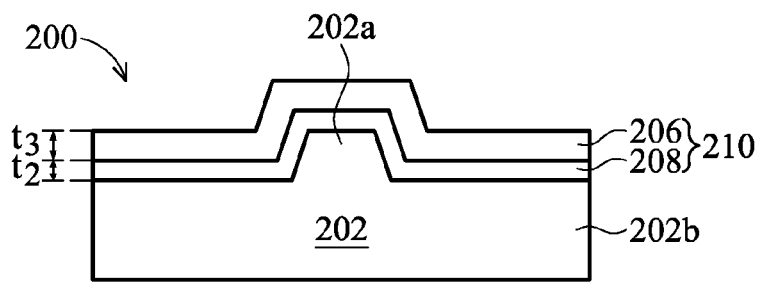
Figure 2D:
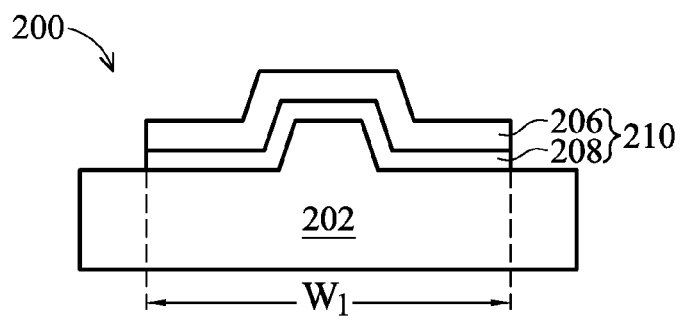

Referring to FIG. 2C, following deposition of the first metal layer 206 over and extending out of the lowered portions 202b and onto the raised portion 202a, an anneal process may be performed to the intermediate semiconductor apparatus 200 in FIG. 2B to form a silicide layer 208 between the first silicon substrate 202 and the first metal layer 206. The anneal process can be performed, for example, in a furnace, a rapid thermal anneal (RTA) system or other thermal system that is adapted to provide a thermal treatment for a reaction between the first silicon substrate 202 and the first metal layer 206 to form the silicide layer 208. Therefore, the silicide layer 208 is on the first metal layer 206. In some embodiments, the anneal process may be performed at a temperature of about 650° C. to 900° C. for about 30 seconds in a RTA system.

In one embodiment, the silicide layer 208 comprises a material selected from a group of Ti, Co, Ni, W, and Pt. In the present embodiment, the silicide layer 208 may comprise a material selected from titanium silicide, cobalt silicide, and nickel silicide. The silicide layer 208 can provide a low-resistance path between the substrate 202 and the first metal layer 206 for good overall electrical conductivity. In one embodiment, the silicide layer 208 has a thickness $t_2$ ranging from 300 to 600 angstroms. The resulted thickness of the first metal layer 206 is thinned to a thickness $t_3$ due to consumption for formation of the silicide layer 208. In the present embodiment, a thickness ratio ($t_3/t_2$) of the first metal layer 206 to the silicide layer 208 is from about 1 to 2.

Then, a layer of photoresist (not shown) is formed over the first metal layer 206 by a suitable process, such as spin-on coating, and patterned to form a patterned photoresist feature by a proper lithography patterning method. A width of the patterned photoresist feature is in the range of about 30 to 80 µm. The patterned photoresist feature can then be transferred using a dry etching process to the underlying layers (i.e., the first metal layer 206 and the silicide layer 208) to form a first contact 210 (shown in FIG. 2D). The first contact 210 is used in the bonding process to electrically connect the MEMS device or IC device in the respective silicon substrate to external features, such as a second contact 310 of the second silicon substrate 302 (shown in FIG. 2E). A first width $W_1$ of the first contact 210 is in the range of about 30 to 80 µm. The photoresist layer may be stripped thereafter.

Figure 2E:
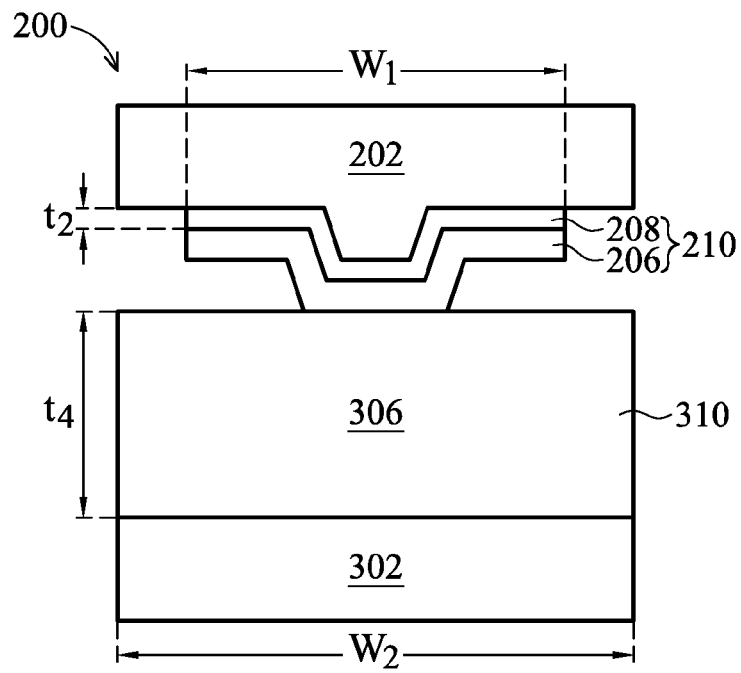

The first silicon substrate 202 is then bonded onto a second silicon substrate 302 to form the semiconductor apparatus 200. The structure of FIG. 2E shows the first silicon substrate 202 is flipped upside down and engaged with the second silicon substrate 302 at the bottom. The second silicon substrate 302 may comprise a pure silicon substrate. In another embodiment, the second silicon substrate 302 may be a semiconductor on insulator, such as silicon on insulator (SOI) or silicon on sapphire. In other embodiments, the second silicon substrate 302 may comprise a doped epi layer, a gradient semiconductor layer, and/or may further include a semiconductor layer overlying another semiconductor layer of a different type, such as a silicon layer on a silicon germanium layer.

In one embodiment, the second silicon substrate 302 may further comprise a plurality of microelectromechanical system (MEMS) devices (not shown). The MEMS devices are the integration of very small mechanical devices installed inside the second silicon substrate 302 such as sensors, valves, gears, reflecting minors, and drivers on a computer. Therefore, the MEMS devices can be used for a variety of devices including oscillators, channels, pumps, accelerometers, and filters. The MEMS devices may be manufactured using surface micromechanics, deposition, or etching technologies.

In another embodiment, the second silicon substrate 302 may further comprise a plurality of isolation features (not shown), such as shallow trench isolation (STI) features or local oxidation of silicon (LOCOS) features. The isolation features may define and isolate various microelectronic elements (not shown).

Examples of the various microelectronic elements that may be formed in the second silicon substrate 302 include transistors (e.g., p-channel/n-channel metal oxide semiconductor field effect transistors (pMOSFETs/nMOSFETs), bipolar junction transistors (BJTs), high voltage transistors, high frequency transistors, etc.); diodes; resistors; capacitors; inductors; fuses; and other suitable elements. Various processes are performed to form the various microelectronic elements including deposition, photolithography, implantation, etching, annealing, and other suitable processes. The microelectronic elements are interconnected to form an integrated circuit (IC) device, such as a logic device, memory device (e.g., static random access memory or SRAM), radio frequency (RF) device, input/output (I/O) device, system-on-chip (SoC) device, combinations thereof, and other suitable types of devices.

The second silicon substrate 302 further comprises inter-layer dielectric (ILD) layers, inter-metal dielectric (IMD) layers and a metallization structure overlying the integrated circuit device (not shown). The IMD layers in the metallization structure include low-k dielectric materials, un-doped silicate glass (USG), fluorine-doped silicate glass (FSG), carbon-doped silicate glass, silicon nitride, silicon oxynitride, or other commonly used materials. The dielectric constants (k value) of the low-k dielectric materials may be less than about 3.9, or less than about 2.3. Metal lines in the metallization structure may be formed of aluminum, aluminum alloy, copper, copper alloys, or other conductive materials. One skilled in the art will realize the formation details of the metallization structure.

The second silicon substrate 302 further comprises a second contact 310. The second contact 310 is a top metallization layer formed in a top-level IMD layer, which is a portion of conductive routes and has an exposed surface treated by a planarization process, such as chemical mechanical polishing (CMP), if necessary. The second contact 310 is used in the bonding process to electrically connect the MEMS device or IC device in the respective silicon substrate to external features, such as the first contact 210 of the first silicon substrate 202. In other words, the first contact 210 is placed in contact with the second contact 310 (shown in FIG. 2E). In one embodiment, a second width $W_2$ of the second contact 310 is greater than the first width $W_1$ of the first contact 210. In another embodiment, the second width $W_2$ of the second contact 310 is less than the first width $W_1$ of the first contact 210. In the present embodiment, a width ratio $(W_1/W_2)$ of the first contact 210 to the second contact 310 is from about 0.12 to 1.2.

The second contact 310 may comprise a second metal layer 306. Suitable materials for the second metal layer 306 may comprise, but are not limited to, for example Al, Al alloy, or other conductive materials. The second metal layer 306 may be formed by chemical vapor deposition (CVD), physical vapor deposition (PVD) or other suitable technique. In the present embodiment, the second metal layer 306 has a thickness $t_4$ ranging from 7500 to 8500 angstroms. In one embodiment, a thickness ratio $(t_4/t_2)$ of the second metal layer 306 to the silicide layer 208 is from about 12 to 25.

Before placing the first contact 210 in contact with the second contact 310, native oxides (not shown) may form on an exposed top surface of the first metal layer 206, as well as a top surface of the second metal layer 306 due to exposure to air. The native oxides need to be cleaned (i.e., removed) because the first and second metal layers 206, 306 will not alloy with each other with the native oxides between the first and second metal layers 206, 306.

In current embodiments of the disclosure, a pre-clean process to remove the native oxides is performed in a pre-clean chamber with a reducing gas, such as hydrogen or $NH_3$, and an inert gas, such as argon, helium or nitrogen. The ratio of the reducing gas to the inert gas depends upon such factors as the particular reaction chamber being used and the particular gasses being used.

In one embodiment, the reducing gas is hydrogen and the inert gas is helium. The hydrogen reactive pre-clean process advantageously removes the native oxide by reducing the native oxide without physical bombardment. Thus, the native oxide can be removed without damaging the exposed top surface of the first metal layer 206, as well as the top surface of the second metal layer 306. This facilitates attempts to form and maintain precise separation distances between the two silicon substrates 202, 302 because the first metal layer 206 and the second metal layer 306 both remain relatively smooth.

The process steps up to this point have provided the silicon substrates 202, 302 having fresh and smooth surfaces to make it easier for alloying the first metal layer 206 and the second metal layer 306 with each other. This can reduce defect generation in the interface between the bonded silicon substrates 202, 302 and upgrade semiconductor apparatus performance.

Figure 2F:
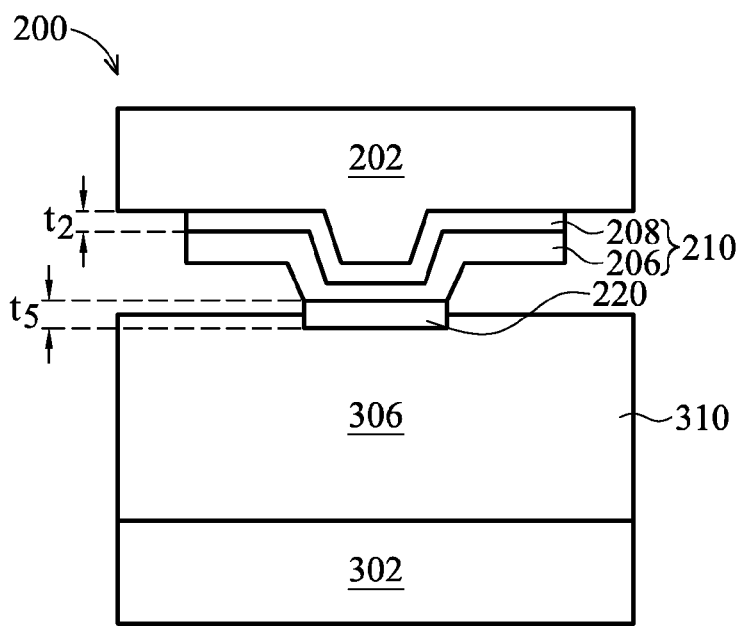

Referring to FIG. 2F, after placing the first contact 210 in contact with the second contact 310, the first and second metal layers 206, 306 are heated to form a metallic alloy 220, whereby the metallic alloy 220 bonds the first contact 210 to the second contact 310. Although other pressures are also possible, the two silicon substrates 202, 302 are pressed together under a compressive force of about 45 to 55 kN to form a weak bond between the first contact 210 and the second contact 310.

The pressed silicon substrates 202, 302 are then placed in an annealing chamber. A bonding process is then performed on the structure of the semiconductor apparatus 200 by varying the temperature within the annealing chamber in order to form the metallic alloy 220 by alloying the first and second metal layers 206, 306, which couples the two silicon substrates 202, 302. In this regard, the temperature of the annealing chamber is increased to about 480° C. within about 60 seconds once the pressed silicon substrates 202, 302 are placed in the annealing chamber. Although not necessary for implementing the invention, the temperature may change linearly (i.e., "ramp" the temperature) when the temperature of the annealing chamber is being varied.

In the present embodiment, the step of heating is performed under a compressive force of about 45 to 55 kN and at a temperature of about 450° to 500° C. for about 40 minutes. It should be noted that other annealing temperatures and durations are possible for forming a sufficient bond between the silicon substrates 202, 302. A bond is "sufficient" for the purposes of the present disclosure when it is capable of maintaining an alignment of the first silicon substrates 202 with respect to the second silicon substrates 302 during normal operation of the semiconductor apparatus 200.

After maintaining the annealing temperature for the prescribed time, the temperature of the annealing chamber is decreased below about 100° C. in about 6 minutes. One skilled in the art should realize that other temperatures and times are possible for the bonding process.

At this point, the metallic alloy 220 may bond the first and second metal layers 206, 306, and be sufficient to keep first silicon substrates 202 attached and aligned to the second silicon substrates 302. In other words, the metallic alloy 220 provides the semiconductor apparatus 200 with mechanical support and low-resistance connection, and the other conductive material such as the silicide layer 208 provides an electrical connection between the MEMS device of the first silicon substrate 202 and the IC device of the second silicon substrate 302. In one embodiment, one of the first or second silicon substrates 202, 302 comprises a micro-electro-mechanical system (MEMS) device and the other substrate comprises an integrated circuit (IC) device. In another embodiment, the first silicon substrate 202 comprises a micro-electro-mechanical system (MEMS) device and the second silicon substrate 302 comprises an integrated circuit (IC) device. Accordingly, Applicant's method of fabricating a semiconductor apparatus 200 may fabricate a low-resistance metallic alloy for bonding the silicon substrates 202, 302 and upgrade semiconductor apparatus performance.

In the present embodiment, the metallic alloy 220 comprises an alloy of the first and second metal layers 206, 306. The metallic alloy 220 may comprise a metallic compound. In the present embodiment, the metallic compound comprises Al. In one embodiment, the metallic compound may comprise $Ti_xAl_y$, such as $TiAl$ or $TiAl_3$, in which the first metal layer 206 comprises Ti and the second metal layer 306 comprises Al. In another embodiment, the metallic compound may comprise $Ni_xAl_y$, such as $NiAl_3$, $Ni_2Al_3$, $NiAl$, or $Ni_3Al$, in which the first metal layer 206 comprises Ni and the second metal layer 306 comprises Al. In still another embodiment, the metallic compound may comprise $Co_xAl_y$, such as $Co_2Al_5$ or $Co_4Al_{13}$, in which the first metal layer 206 comprises Co and the second metal layer 306 comprises Al. In still another embodiment, the metallic compound may comprise $Al_xW_y$, such as $Al_{12}W$, $Al_5W$, or $Al_4W$, in which the first metal layer 206 comprises W and the second metal layer 306 comprises Al. In still another embodiment, the metallic compound may comprise $Pt_xAl_y$, such as $Pt_2Al_3$, in which the first metal layer 206 comprises Pt and the second metal layer 306 comprises Al. In the present embodiment, the metallic alloy 220 has a thickness $t_5$ ranging from 500 to 1500 angstroms. In one embodiment, a thickness ratio ($t_5/t_2$) of the metallic alloy 220 to the silicide layer 208 is from about 0.8 to 5.

Figure 3:
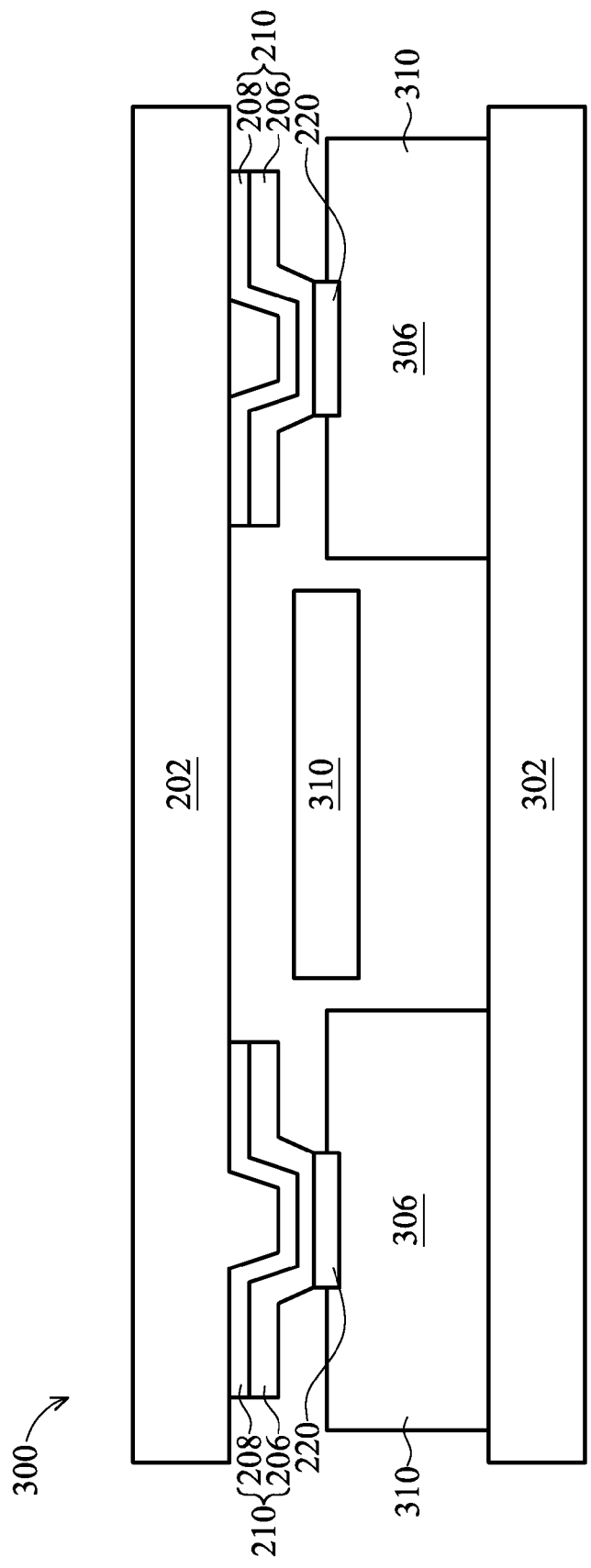
FIG. 3 is a cross-sectional view of a semiconductor apparatus having a metallic alloy fabricated using the steps shown in FIG. 2A-2F.

FIG. 3 is a cross-sectional view of a semiconductor apparatus 300 having a metallic alloy 220 fabricated using the steps shown in FIG. 2A-2F. A supporting mechanism (not shown) elastically supports mass proof of MEMS device 320, such as a mirror on the first silicon substrate 202, in which the mirror floats from the first silicon substrate 202, so that the minor can be inclined in an arbitrary direction. On the other hand, mass proof of MEMS device 320, such as a rotor, may be floating above the second silicon substrate 302 and controlled by a driving structure (not shown). It is understood that the semiconductor apparatus 300 may undergo further IC processing to form various features such as under-fill, leadframe, etc.

While the disclosure has been described by way of example and in terms of the above embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor apparatus comprising:
   a first silicon substrate having a first contact comprising a silicide layer between the substrate and a first metal layer, wherein a thickness ratio of the first metal layer to the silicide layer is from about 1 to 2;
   a second silicon substrate having a second contact comprising a second metal layer; and
   a metallic alloy between the first metal layer of the first contact and the second metal layer of the second contact.

2. The semiconductor apparatus of claim 1, wherein a width ratio of the first contact to the second contact is from about 0.12 to 1.2.

3. The semiconductor apparatus of claim 1, wherein the silicide layer comprises a material selected from a group of Ti, Co, Ni, W, and Pt.

4. The semiconductor apparatus of claim 1, wherein the first metal layer comprises a material selected from a group of Ti, Co, Ni, W, and Pt.

5. The semiconductor apparatus of claim 1, wherein the silicide layer is on the first metal layer.

6. The semiconductor apparatus of claim 1, wherein the silicide layer comprises a compound including silicon from the first silicon substrate and a material from the first metal layer.

7. The semiconductor apparatus of claim 1, wherein the second metal layer comprises Al or Al alloy.

8. The semiconductor apparatus of claim 1, wherein a thickness ratio of the second metal layer to the silicide layer is from about 12 to 25.

9. The semiconductor apparatus of claim 1, wherein the metallic alloy comprises an alloy of the first and second metal layers.

10. The semiconductor apparatus of claim 1, wherein the metallic alloy comprises a metallic compound.

11. The semiconductor apparatus of claim 10, wherein the metallic compound comprises Al.

12. The semiconductor apparatus of claim 1, wherein a thickness ratio of the metallic alloy to the silicide layer is from about 0.8 to 5.

13. The semiconductor apparatus of claim 1, wherein one of the first or second silicon substrates comprises a micro-electro-mechanical system (MEMS) device and the other substrate comprises an integrated circuit (IC) device.

14. The semiconductor apparatus of claim 1, wherein the first silicon substrate comprises a micro-electro-mechanical system (MEMS) device and the second silicon substrate comprises an integrated circuit (IC) device.

15. A semiconductor apparatus comprising:
   a first silicon substrate;
   a second silicon substrate;
   a first contact structure between the first silicon substrate and the second silicon substrate;
   a second contact structure between the first silicon substrate and the second silicon substrate, wherein each of the first and second contact structures comprise:
      a first contact region comprising a silicide layer between the substrate and a first metal layer, wherein a thickness ratio of the first metal layer to the silicide layer is from about 1 to 2;
      a second contact region comprising a second metal layer; and
      a metallic alloy between the first metal layer of the first contact region and the second metal layer of the second contact region; and a micro-electrical mechanical system (MEMS) device positioned between the first contact structure and the second contact structure.

16. The semiconductor apparatus of claim 15, wherein a thickness ratio of the metallic alloy to the silicide layer is from about 0.8 to 5.

17. The semiconductor apparatus of claim 15, wherein the first metal layer comprises a material selected from a group of Ti, Co, Ni, W, and Pt.

18. The semiconductor apparatus of claim 17, wherein the second metal layer comprises Al or Al alloy.

19. The semiconductor apparatus of claim 18, wherein the metallic alloy comprises an alloy of the first and second metal layers.

20. A semiconductor apparatus comprising:
a first silicon substrate having a first contact comprising a silicide layer between the substrate and a first metal layer;
a second silicon substrate having a second contact comprising a second metal layer, wherein a thickness ratio of the second metal layer to the silicide layer is from about 12 to 25; and
a metallic alloy between the first metal layer of the first contact and the second metal layer of the second contact.

* * * * *